(12) United States Patent
Banerjee et al.

(10) Patent No.: US 6,998,931 B2
(45) Date of Patent: Feb. 14, 2006

(54) REFERENCE IMPEDANCE APPARATUS, SYSTEMS, AND METHODS

(75) Inventors: Gaurab Banerjee, Beaverton, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 158 days.

(21) Appl. No.: 10/336,233

(22) Filed: Jan. 3, 2003

(65) Prior Publication Data

US 2004/0130408 A1   Jul. 8, 2004

(51) Int. Cl.
   *H03H 7/38*   (2006.01)
(52) U.S. Cl. .......................... 333/33; 333/246
(58) Field of Classification Search ........... 333/238, 333/246, 33–35
   See application file for complete search history.

(56) References Cited

U.S. PATENT DOCUMENTS 6,166,599 A * 12/2000 Aparin et al. ............. 330/149
6,670,865 B1 * 12/2003 Lopez ........................ 333/33

OTHER PUBLICATIONS

Horn, Delton T., Basic Elecronics Theory, 1994, TAB Books, 4th edition, p. 467.*
Fujimoto, R., et al., "A 7-GHz 1.8-dB NF CMOS Low-Noise Amplifier", *IEEE Journal of Solid-State Circuits*, vol. 37, No. 7, Jul. 2002, pp. 852-856.
Goo, Jung-Suk, et al., "A Noise Optimization Technique for Integrated Low-Noise Amplifiers", *IEEE Journal of Solid-State Circuits*, vol. 37, No. 8, Aug. 2002, pp. 994-1002.

* cited by examiner

*Primary Examiner*—Stephen E. Jones
(74) *Attorney, Agent, or Firm*—Schwegman, Lundberg, Woessner & Kluth, P.A.

(57) ABSTRACT

An apparatus and system may include a microstrip line capable of being coupled to an amplifier, wherein the microstrip line is to transform an input impedance of the amplifier to a substantially resistive value, and wherein the microstrip line has a characteristic impedance approximately equal to a selected system reference impedance. The apparatus and system may include a transformer coupled to the microstrip line, wherein the transformer is to transform the substantially resistive value into approximately a resistance of a source impedance included in a source. An article may include data, which, when accessed, results in a machine performing a method including simulating selecting a system having a reference impedance and simulating coupling an amplifier having an input impedance to a source having a source impedance using a transformer coupled to a microstrip line.

29 Claims, 4 Drawing Sheets

REFERENCE IMPEDANCE APPARATUS, SYSTEMS, AND METHODS

TECHNICAL FIELD

Embodiments of the invention relate generally to apparatus, systems, and methods used to conduct signals and to optimize impedance interface conditions, including matching networks and impedance transformers.

BACKGROUND INFORMATION

Conventional integrated circuit designs typically use amplification structures with inductive source degeneration to provide 50 ohm inputs. The associated on-chip inductors can be large, area-inefficient, and contribute to resonant-tuning at the input. Narrow bandwidth, along with a reduced number of potential applications, may result.

Other disadvantages arise when input matching networks with discrete inductors or microstrip lines are used, especially when implemented off-chip to minimize losses and associated noise. Discrete large-valued inductors may have low self-resonant frequencies, sensitizing the design to manufacturing variations. Microstrip matching typically makes use of traces connecting to 50 ohm interfaces, narrowing design choices and rendering the accommodation of other design trade-offs more difficult.

Finally, conventional apparatus often use wire bonds or C4 bumps to connect chips to a package or a board trace. The added reactance often renders the final design (and associated yield) particularly sensitive to manufacturing-induced variations.

DETAILED DESCRIPTION

Figure 1:
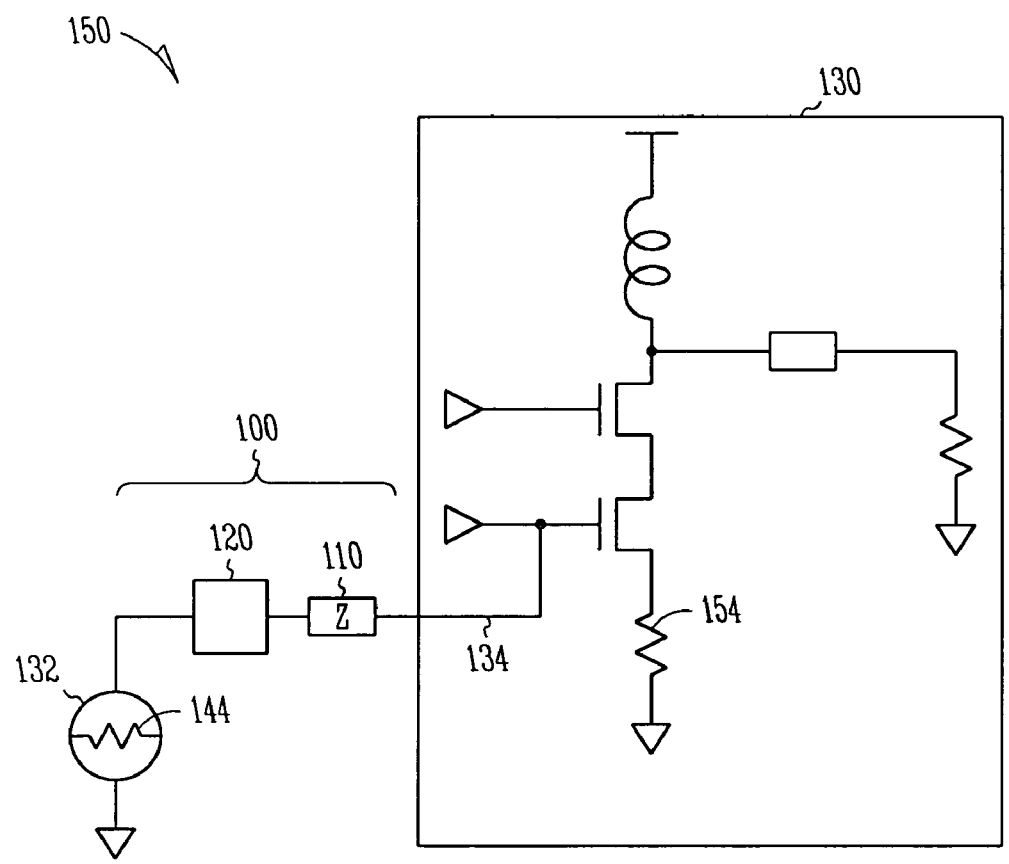
FIG. 1 is a block diagram of an apparatus and a system according to various embodiments of the invention.

In the following detailed description of various embodiments of the invention, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The following detailed description, therefore, is not to be taken in a limiting sense, and the scope of various embodiments of the invention is defined only by the appended claims, along with the full range of equivalents to which such claims are entitled.

FIG. 1 is a block diagram of an apparatus and a system according to various embodiments of the invention. The apparatus 100 may comprise a microstrip line 110 capable of being coupled to a transformer 120. The microstrip line 110 is also capable of being coupled to an amplifier 130, whereas the transformer 120 is capable of being coupled to a source 132. The microstrip line 110 may be used to transform an input impedance 134 of the amplifier 130 to a substantially resistive value, including a purely resistive value. For the purposes of this disclosure, the term "substantially resistive" with respect to an impedance means an impedance which has substantially more resistance than reactance, such as where the value of the resistance in ohms is at least ten times the value of the reactance in ohms, and includes an impedance having a purely resistive nature (i.e., no reactive component).

The microstrip line 110 may be designed so as to have a characteristic impedance Z (which may be substantially resistive in nature) approximately equal to a selected system reference impedance (which also may be substantially resistive in nature). The selected system reference impedance may be any value, including a resistance of about 1 ohm to about 200 ohms, and may be selected to facilitate determining a noise figure/return-loss trade-off, and/or to provide greater immunity to manufacturing variations.

The transformer 120 may be used to transform the substantially resistive value of the transformed amplifier input impedance into approximately the same value of resistance as the value of resistance included in the source impedance 144 of the source 132. The value of resistance included in the source impedance 144 may be about 50 ohms, or some other value, such as between about 10 ohms and about 200 ohms, and may be determined by a parametric search strategy to determine the source resistance which provides an optimum noise figure, or an optimum return-loss, or an optimal trade-off between noise figure and return-loss. However, a source impedance 144 including a source resistance of about 50 ohms may also be determined as a matter of convenience since many available transmitters, receivers, and transceivers make use of this value.

The transformer 120 may comprise any number of devices, including one or more quarter-wave microstrip transformers. The amplifier 130 may include a resistive source termination in a differential-cascode topology, so as to conserve die area. The transformer 120, as well as the microstrip line 110, may be fabricated on a printed circuit board or in a package, for example, or by using conductive segments (e.g., metal segments) on silicon.

When constructed using conductive segments, the transformer may have a length that is about one-tenth to about ten times the length of the microstrip line. The transformer may have a width that is about one-half to about one hundred times the width of the microstrip line. For example, at an operating frequency of about 5.5 GHz, using an RO4003 substrate that is about 20 mils thick with a dielectric constant of about 3.4, a 120 ohm microstrip line that introduces a phase shift of about 55 degrees may be chosen to be about 210 mils long and 6 mils wide (where 1 mil=$\frac{1}{1000}$ of an inch, or 0.03 mm). To transform a substantially resistive value of the transformed amplifier input impedance of about 15 ohms into the value of resistance 144 of about 50 ohms, the characteristic impedance of the transformer should be about: $\sqrt{15 \times 50} \approx 27$ ohms. Thus, the transformer may have a length of about 310 mils and a width of about 110 mils.

Other embodiments of the invention may also be realized. For example, as shown in FIG. 1, a system 150 may comprise an amplifier 130, a microstrip line 110 capable of being coupled to the amplifier 130, and a transformer 120 coupled to the microstrip line 110. As noted above, the microstrip line 110 may be used to transform an input impedance 134 of the amplifier 130 to a substantially resistive value, and the microstrip line 110 may be designed so as to have a characteristic impedance Z approximately equal to a selected system reference impedance. The transformer 130 is capable of being coupled to a source 132, and may be used to transform the substantially resistive value into, or so as to be approximately the same as, the resistance of a source impedance 144 included in the source 132.

The amplifier 130 may include any number of amplification elements, including transistors of many types, such as field effect transistors (FETs) and bipolar transistors. The amplifier 130 may be constructed in a number of different configurations, including a differential cascode topology. The amplifier 130 may also be designed to provide any amount of gain, including positive gain, negative gain, or fractional amounts of gain, including a gain of 1:1, such as may be provided by a buffer amplifier.

The system 150 may also include a substantially resistive degenerating termination 154 coupled to the amplifier 130. The substantially resistive degenerating termination 154 may have a resistance of less than about 50 ohms, and more preferably, a resistance of less than about 20 ohms. The substantially resistive degenerating termination 154 may be fabricated using conductive segments (e.g., metal segments) on silicon, including a process using tantalum or polysilicon segments. Smaller physical sizes are preferred for constructing the substantially resistive degenerating termination 154, so as not to adversely affect the gain or noise figure of the amplifier 130, and so as to consume a smaller amount of die or board surface area.

The apparatus 100, microstrip line 110, transformer 120, amplifier 130, source 132, input impedance 134, source impedance 144, system 150, and the substantially resistive degenerating termination 154 may all be characterized as "modules" herein. Such modules may include hardware circuitry, and/or a processor and/or memory circuits, software program modules and objects, and/or firmware, and combinations thereof, as desired by the architect of the apparatus 100 and the system 150, and as appropriate for particular implementations of various embodiments of the invention. For example, such modules may be included in a circuitry simulation package, such as a software simulation package, or a combination of software and hardware used to simulate potential circuit designs.

It should also be understood that the apparatus and systems of various embodiments of the invention can be used in applications other than for data transfer, and other than for systems that include computers, and thus, embodiments of the invention are not to be so limited. The illustrations of an apparatus 100 and a system 150 are intended to provide a general understanding of the structure of various embodiments of the invention, and they are not intended to serve as a complete description of all the elements and features of apparatus and systems that might make use of the structures described herein.

Applications which may include the novel apparatus and systems of various embodiments of the invention include electronic circuitry used in high-speed computers, communication and signal processing circuitry, data transceivers, modems, processor modules, embedded processors, and application-specific modules, including multilayer, multichip modules. Such apparatus and systems may further be included as sub-components within a variety of electronic systems, such as televisions, cellular telephones, personal computers, workstations, radios, video players, vehicles, and others.

Embodiments of the invention also include a number of methods. Considerations include selecting a selected system reference impedance, which need not be equal to 50 Ohms, is chosen. Design trade-offs, such as input matching versus noise figure, can be relaxed. The selected system reference impedance can be converted to a 50 Ohm impedance at the interface to the source by using a quarter wave transformer, whose tuned response may help reject out-of band noise and interferers, but which can have broad-band characteristics obtainable by multi-section matching or tapering. Techniques used to implement multi-section matching and tapering may be reviewed by referring to microwave engineering textbooks, including Microwave Engineering by David M. Pozar, 2nd edition, pp 271–289.

If the selected system reference impedance is selected to be X Ohms, the s-parameters and noise parameters of the amplification element(s) used in the amplifier 130 can be transformed to an X-ohm system. The precise value of the selected system reference impedance may be chosen to provide a better noise figure and/or return-loss than if a 50 ohm system were chosen. A search for the optimal system reference impedance could be made using a number of design frequencies, either via direct calculation or parametric simulation.

For example, selecting a system reference impedance including a resistance of greater than about 50 ohms, and preferably, greater than about 100 ohms may desensitize the apparatus 100 and system 150 to manufacturing variations. This is because microstrip traces on circuit boards or within packages connected to on-chip pads using wire-bonds or C4 bumps may introduce additional inductive reactance. During input matching, this additional reactance may be normalized by the selected system reference impedance. Thus, if a higher impedance value is chosen, such as greater than 100 ohms (e.g. about 120 ohms), the effect of the added inductance is reduced by a factor of $j\omega dL/120$ versus $j\omega dL/50$ (e.g., assuming a "standard" system reference impedance of 50 ohms). Further, if a substantially non-resonant input provided by using a substantially resistive degenerating termination 154 coupled to the amplifier 130, instead of a source degenerating inductor, the sensitivity to the value of added inductance may be further reduced. In designs of this type, the noise figure may be improved by up to 30% and more, while the bandwidth may be improved by up to 100%, and more, particularly when operated over a source-generated frequency range of about 1 to about 6 GHz.

Figure 2:
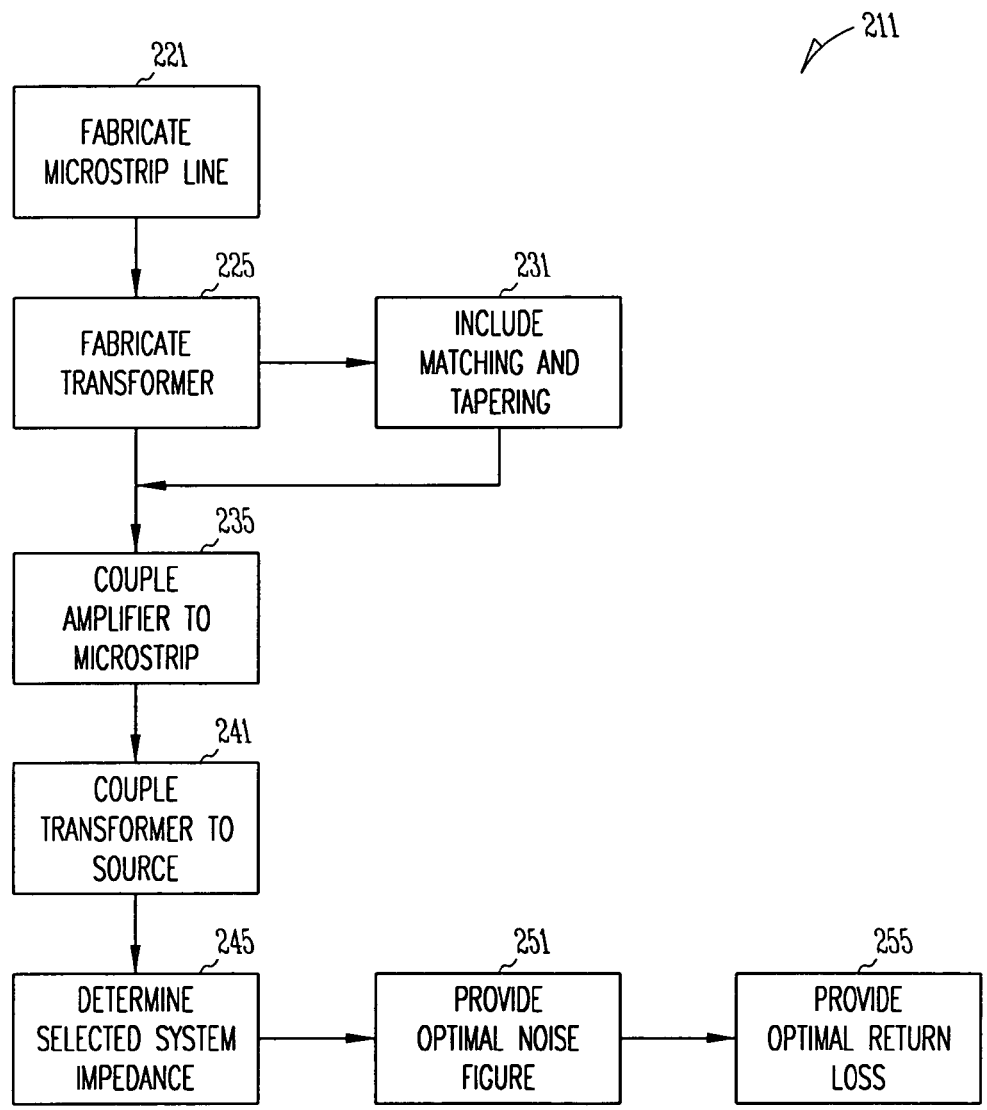
FIG. 2 is a flow chart illustrating several methods according to various embodiments of the invention.

FIG. 2 is a flow chart illustrating several methods according to various embodiments of the invention. The method 211 may begin with fabricating a microstrip line at block 221, and continue with fabricating a transformer (e.g., a quarter-wave transformer) to be coupled to the microstrip line at block 225. The transformer may be fabricated so as to include multi-section matching and/or tapering.

As noted previously, an amplifier having an input impedance can be coupled to a source having a source impedance using the transformer coupled to the microstrip line, wherein the microstrip line may be used to transform an input impedance of the amplifier to a substantially resistive value. The microstrip line may have a characteristic impedance selected so as to be approximately equal to a selected system reference impedance, and the transformer may be used to transform the substantially resistive value into approximately a resistance included in the source impedance.

Thus, the method 211 may include coupling the amplifier including a substantially resistive degenerating termination to the microstrip line at block 235, coupling the transformer to the source at block 241, and determining the selected system reference impedance by implementing a parametric search strategy at block 245, which may in turn include selecting the selected system reference impedance to provide an optimal noise figure at block 251 and/or selecting the selected system reference impedance to provide an optimal return-loss at block 255. As noted above, the resistance included in the source impedance may be about 50 ohms, and the selected system reference impedance may include a resistance of greater than about 100 ohms.

Figure 3:
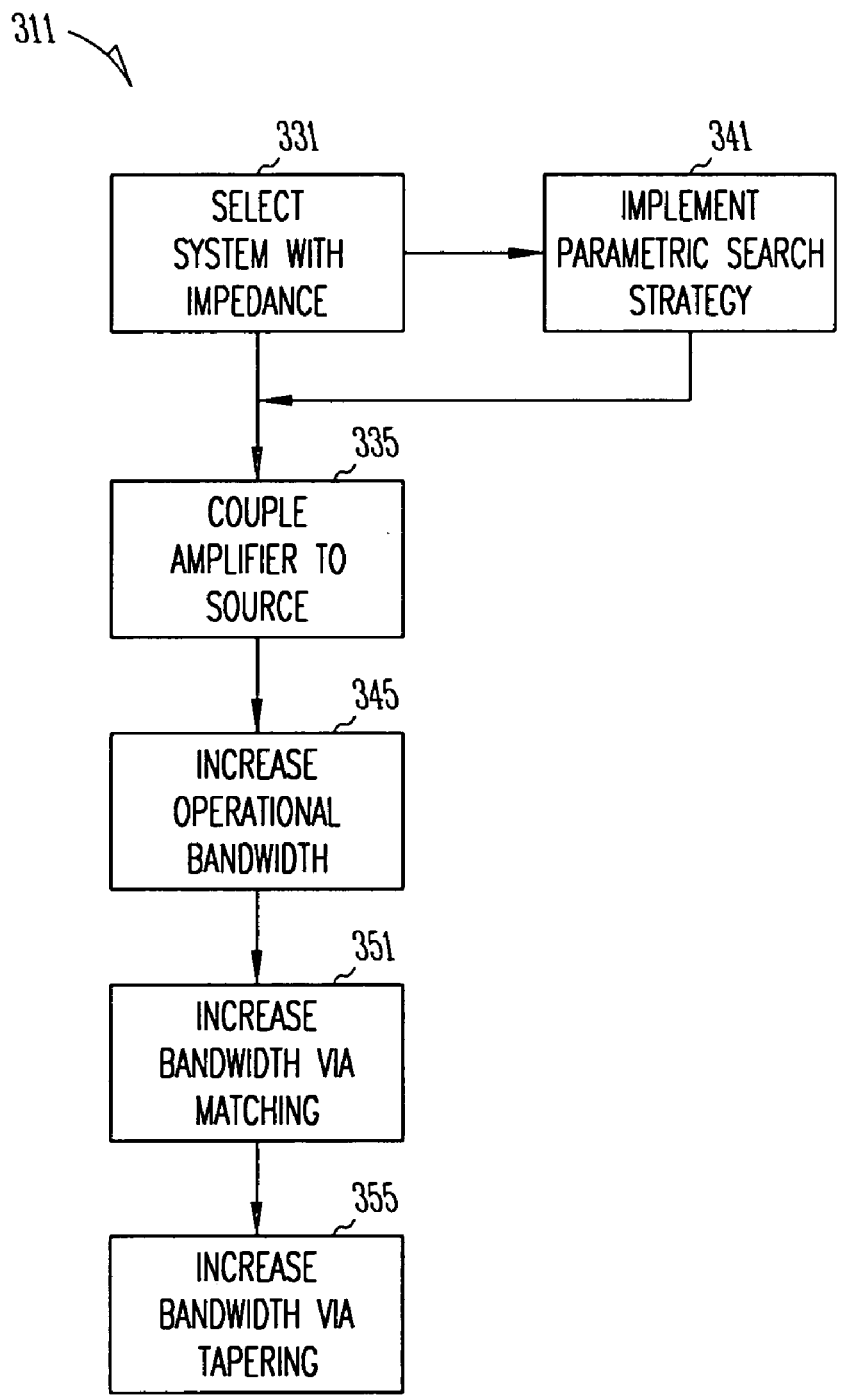
FIG. 3 is a flow chart illustrating alternative methods according to various embodiments of the invention.

FIG. 3 is a flow chart illustrating alternative methods according to various embodiments of the invention. For example, a method 311 may include selecting (or simulating selecting) a system having a reference impedance at block 331, and coupling (or simulating coupling) an amplifier having an input impedance to a source having a source impedance using a transformer coupled to a microstrip line at block 335. Selecting (or simulating selecting) a system having a reference impedance may further include implementing a parametric search strategy to select the reference impedance using a selected tradeoff between a return-loss and a noise figure at block 341. The amplifier may include a substantially non-resonant degenerating termination, as noted above. The method 311 may also include increasing (or simulating increasing) an operational bandwidth of the transformer at block 345, including by multi-section matching at block 351, and/or via tapering at block 355.

It should be noted that the methods described herein do not have to be executed in the order described, or in any particular order. Moreover, various activities described with respect to the methods identified herein can be executed in serial or parallel fashion.

Figure 4:
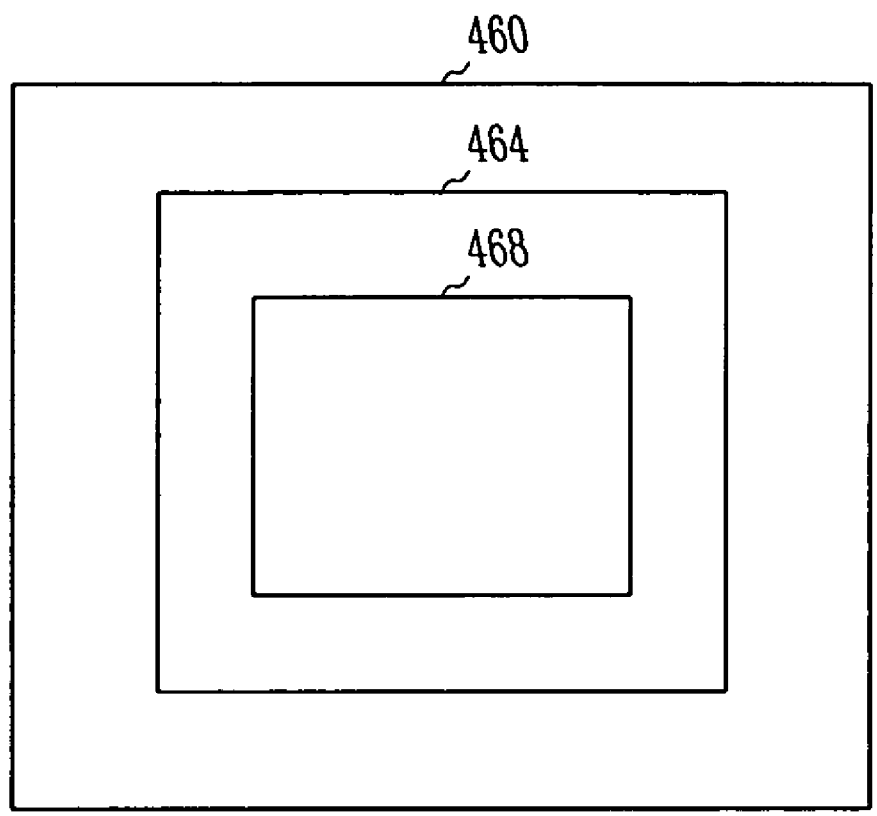
FIG. 4 is a block diagram of an article according to various embodiments of the invention.

FIG. 4 is a block diagram of an article according to various embodiments of the invention. Thus, another embodiment of the invention may include an article 460, such as a computer, a memory system, a magnetic or optical disk, some other storage device, and/or any type of electronic device or system, comprising a machine-accessible medium such as a memory 464 (e.g., a memory including an electrical, optical, or electromagnetic conductor) having associated data 468 (e.g. computer program instructions), which when accessed, results in a machine performing such actions as selecting (or simulating selecting) a system having a reference impedance and coupling (or simulating coupling) an amplifier having an input impedance to a source having a source impedance using a transformer coupled to a microstrip line. Other activities may include implementing a parametric search strategy to select the reference impedance using a selected tradeoff between a return-loss and/or a noise figure, as well as increasing (or simulating increasing) an operational bandwidth of the transformer by multi-section matching and/or tapering.

Although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein will be apparent to those of skill in the art upon reviewing the above description.

The scope of various embodiments of the invention includes any other applications in which the above structures and methods are used. Therefore, the scope of various embodiments of the invention should be determined with reference to the appended claims, along with the full range of equivalents to which such claims are entitled.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
    a microstrip line capable of being coupled to an amplifier, wherein the microstrip line is to transform an input impedance of the amplifier to a substantially resistive value, and wherein the microstrip line has a characteristic impedance approximately equal to a selected system reference impedance; and
    a transformer coupled to the microstrip line and capable of being coupled to a source, wherein the transformer is to transform the substantially resistive value into approximately a resistance of a source impedance included in the source.

2. The apparatus of claim 1, wherein the transformer further comprises:
    a quarter-wave microstrip transformer.

3. The apparatus of claim 1, wherein the selected system reference impedance includes a resistance of about 1 ohm to about 200 ohms.

4. The apparatus of claim 1, wherein the resistance of the source impedance is about 50 ohms.

5. The apparatus of claim 1, wherein the microstrip line and the transformer are fabricated using conductive segments on silicon.

6. The apparatus of claim 5, wherein the transformer has a length that is about one-tenth to about ten times the length of the microstrip line, and wherein the transformer has a width that is about one-half to about one hundred times the width of the microstrip line.

7. An apparatus, comprising:
    a microstrip line capable of being coupled to an amplifier, wherein the microstrip line is to transform an input impedance of the amplifier to a substantially resistive value, and wherein the microstrip line has a characteristic impedance approximately equal to a selected system reference impedance;
    a transformer coupled to the microstrip line; and
    a source coupled to the transformer, wherein the transformer is to transform the substantially resistive value into approximately a resistance of a source impedance included in the source.

8. The apparatus of claim 7, wherein the transformer further comprises:
    a quarter-wave microstrip transformer.

9. The apparatus of claim 7, wherein the selected system reference impedance includes a resistance of about 1 ohm to about 200 ohms.

10. The apparatus of claim 7, wherein the resistance of the source impedance is about 50 ohms.

11. The apparatus of claim 7, wherein the amplifier has a gain of substantially 1:1.

12. The apparatus of claim 7, wherein the transformer is designed to operate at a frequency of approximately 5.5 GHz.

13. The apparatus of claim 7, wherein the microstrip line and the transformer are fabricated using conductive segments on silicon.

14. A system, comprising:

an amplifier;

a microstrip line capable of being coupled to the amplifier, wherein the microstrip line is to transform an input impedance of the amplifier to a substantially resistive value, and wherein the microstrip line has a characteristic impedance approximately equal to a selected system reference impedance; and a transformer coupled to the microstrip line and capable of being coupled to a source, wherein the transformer is to transform the substantially resistive value into approximately a resistance of a source impedance included in the source.

15. The system of claim 14, wherein the amplifier has a differential cascode topology.

16. The system of claim 14, further comprising:

a substantially resistive degenerating termination coupled to the amplifier, wherein the substantially resistive degenerating termination has a resistance of less than about 50 ohms.

17. The system of claim 14, wherein the transformer further comprises:

a quarter-wave microstrip transformer.

18. The system of claim 14, wherein the microstrip line and the transformer are fabricated using conductive segments on silicon.

19. The system of claim 14, further including:

the source coupled to the transformer.

20. The system of claim 14, wherein the amplifier has a gain of substantially 1:1.

21. A method, comprising:

fabricating a microstrip line; and fabricating a transformer to be coupled to the microstrip line, wherein an amplifier having an input impedance can be coupled to a source having a source impedance using the transformer coupled to the microstrip line, wherein the microstrip line is to transform an input impedance of the amplifier to a substantially resistive value, wherein the microstrip line has a characteristic impedance approximately equal to a selected system reference impedance, and wherein the transformer is to transform the substantially resistive value into approximately a resistance included in the source impedance.

22. The method of claim 21, further comprising:

coupling the amplifier including a substantially resistive degenerating termination to the microstrip line.

23. The method of claim 21, further comprising:

coupling the transformer to the source.

24. The method of claim 21, further comprising:

fabricating the transformer so as to include one of multi-section matching and tapering.

25. The method of claim 21, wherein the resistance included in the source impedance is about 50 ohms.

26. The method of claim 21, wherein the selected system reference impedance includes a resistance of greater than about 100 ohms.

27. The method of claim 21, further comprising:

determining the selected system reference impedance by implementing a parametric search strategy.

28. The method of claim 27, wherein determining the selected system reference impedance by implementing a parametric search strategy further comprises:

selecting the selected system reference impedance to provide an optimal noise figure.

29. The method of claim 27, wherein determining the selected system reference impedance by implementing a parametric search strategy further comprises: selecting the selected system reference impedance to provide an optimal return-loss.

* * * * *